US006606361B1

(12) United States Patent
Rowell

(10) Patent No.: US 6,606,361 B1
(45) Date of Patent: Aug. 12, 2003

(54) CIRCUITS, SYSTEMS, AND METHODS FOR PROVIDING A SINGLE OUTPUT CLOCK AND OUTPUT DATA STREAM FROM AN INTERFACE HAVING MULTIPLE CLOCKS AND AN INPUT DATA STREAM

(76) Inventor: Anthony S. Rowell, 11 Manor Close, Irchester, Northamptonshire (GB), NN29 7ED ( * ) Notice: Subject to any disclaimer, the term of this patent is extended or adjusted under 35 U.S.C. 154(b) by 0 days.

(21) Appl. No.: 09/407,815

(22) Filed: Sep. 28, 1999

(51) Int. Cl.[7] .............................................. H04L 7/00
(52) U.S. Cl. ...................... 375/355; 327/145; 327/298
(58) Field of Search ................................ 375/354, 355, 375/368, 360, 377; 327/100, 141, 144, 45, 291, 148, 145, 294, 298; 326/93

(56) References Cited

U.S. PATENT DOCUMENTS 4,855,735 A * 8/1989 Webb et al. ............ 340/870.14
4,912,730 A * 3/1990 Erhart ........................ 375/361
5,229,668 A * 7/1993 Hughes et al. .............. 327/271

* cited by examiner

Primary Examiner—Jean Corrielus
(74) Attorney, Agent, or Firm—Peter P. Hernandez; W. James Brady, III; Frederick J. Telecky, Jr.

(57) ABSTRACT

A circuit (10) for producing a single output data ($D_{OUT}$) stream and a corresponding single clock signal ($CLK_{OUT}$). This circuit comprises an input for receiving a single input data stream ($D_{IN}$), where the input data stream has data words at a first frequency. This circuit further includes a plurality of clock inputs for receiving a plurality of corresponding clock signals ($CLK_0$, $CLK_1$), where each of the plurality of corresponding clock signals is synchronized to a corresponding plurality of the data words. This circuit still further includes an input for receiving a fast clock signal ($CLK_F$), where the fast clock signal has a fast frequency greater than the first frequency. The circuit also includes various circuitry. This circuitry includes circuitry for sampling ($L2_0$, $L2_1$) the input data stream at the fast frequency, circuitry for outputting (M, $L_M$) the sampled data as the single output data stream, and circuitry for outputting (CG) the single clock cycle in response to the fast clock signal.

17 Claims, 2 Drawing Sheets

CIRCUITS, SYSTEMS, AND METHODS FOR PROVIDING A SINGLE OUTPUT CLOCK AND OUTPUT DATA STREAM FROM AN INTERFACE HAVING MULTIPLE CLOCKS AND AN INPUT DATA STREAM

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to digital data circuits, and are more particularly directed to systems presenting multiple clocks with a single data bus.

In many digital data systems or circuits, the system includes a single data bus and a corresponding single clock signal, where a high (or possibly low) clock transition designates the proper sampling time for the corresponding data; however, in some systems, such as the gigabit internet standard identified by IEEE 802.3Z, the historic evolution of the system has resulted in a single data bus, but with two out of phase clocks. More particularly, part of the data on the gigabit internet standard data bus is properly sampled according to a first of these two clocks while a different part of the data on that bus is properly sampled according to a second of these two clocks. While this interface is provided as part of a standard and is somewhat prevalent, it often creates complexities or difficulties for systems that connect to this interface because most often such systems have been developed or are developed with an internal expectation of a single data bus and a single corresponding clock signal.

One prior art approach has been attempted in an effort to convert the dual clock system provided by an interface such as the gigabit internet standard to a single clock signal. More particularly, this prior art approach implements a phase locked loop ("PLL") which has an oscillator which runs at a given clock frequency, and which has a phase detector for comparing the phase difference between a PLL reference signal and the two different clock signals provided by the interface. In response to this comparison, the PLL outputs a single output clock signal at a frequency equal to twice the frequency of either of the two interface clocks. While this approach provides a single clock signal corresponding to the single data bus, it is well known in the PLL art that PLLs are subject to various drawbacks. For example, implementing a PLL that operates properly and does not fluctuate in its comparison or output functions may be considerably complex. As another example, implementing a PLL may be considerably expensive.

In view of the above, there arises a need to address the drawbacks of the prior art and the complexities arising from the gigabit internet standard or other systems providing a multiple clock, single data bus, interface, and this need is satisfied by the preferred embodiment described below.

BRIEF SUMMARY OF THE INVENTION

In the preferred embodiment, there is a circuit for producing a single output data stream and a corresponding single clock signal. This circuit comprises an input for receiving a single input data stream, where the input data stream has data words at a first frequency. This circuit further includes a plurality of clock inputs for receiving a plurality of corresponding clock signals, where each of the plurality of corresponding clock signals is synchronized to a corresponding plurality of the data words. This circuit still further includes an input for receiving a fast clock signal, where the fast clock signal has a fast frequency greater than the first frequency. The circuit also includes various circuitry. This circuitry includes circuitry for sampling the input data stream at the fast frequency, circuitry for outputting the sampled data as the single output data stream, and circuitry for outputting the single clock cycle in response to the fast clock signal. Other circuits, systems, and methods are also disclosed and claimed.

DETAILED DESCRIPTION OF THE INVENTION

Figure 1:
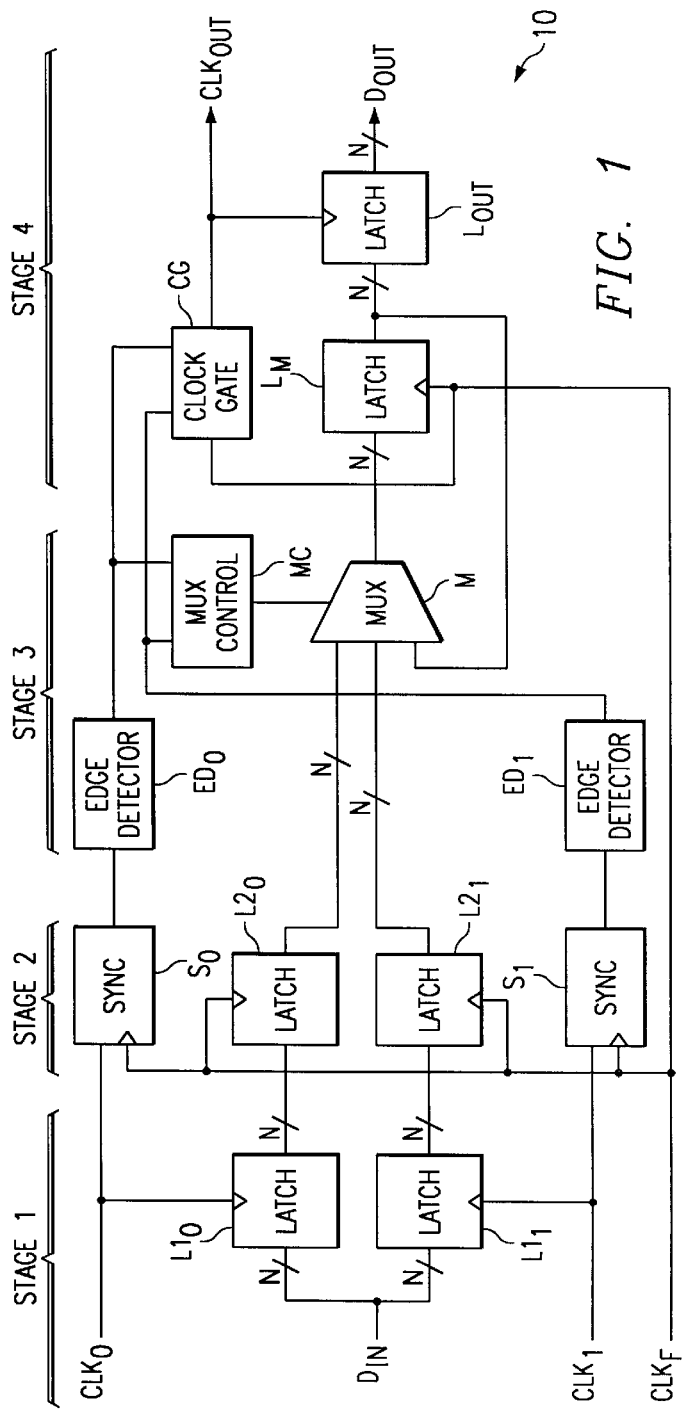
FIG. 1 illustrates a schematic of a clock/data conversion circuit in accordance with the preferred embodiment.

FIG. 1 illustrates a schematic of a clock/data conversion circuit designated generally at 10. As introduced in the earlier Background Of The Invention section of this document, clock/data conversion circuit 10 is operable to receive a single data input along with two clock signals corresponding to that input, and further to output a single data output with only a single corresponding clock signal. As more particularly illustrated in FIG. 1, the single data input is shown as an N bit data signal $D_{IN}$, and the two corresponding clock signals are $CLK_0$ and $CLK_1$, each having a same frequency and being out of phase with respect to one another, and each being synchronized to different data within $D_{IN}$. These data and clock signals may be received from various interfaces, with the gigabit internet interface described earlier as a particular example. In any event, and as detailed below, in response to its input data and clocks, clock/data conversion circuit 10 outputs a single N bit data stream $D_{OUT}$ and a single corresponding clock $CLK_{OUT}$. For the sake of reference, this functionality is shown and achieved through circuitry subdivided into four stages STAGE 1 through STAGE 4, each of which is detailed below.

Looking to STAGE 1, it includes a latch $L1_0$ which receives $D_{IN}$ at its data input and which is clocked by $CLK_0$. STAGE 1 further includes a latch $L1_1$ which also receives $D_{IN}$ at its data input and which is clocked by $CLK_1$. The outputs of latches $L1_0$ and $L1_1$ are passed to STAGE 2. For the sake of example, assume that the frequency of $CLK_0$ and $CLK_1$ equals 62.5 MHz and, thus, one skilled in the art will appreciate that $D_{IN}$ is provided at a frequency of 125 MHz.

STAGE 2, like STAGE 1, includes two latches, where each latch receives at its input an output from a corresponding one of the STAGE 1 latches. More particularly, STAGE 2 includes a latch $L2_0$ which receives at its data input the output of latch $L1_0$. Similarly, STAGE 2 includes a latch $L2_1$ which receives at its data input the output of latch $L1_1$. The outputs of latches $L2_0$ and $L2_1$ are passed to STAGE 3. The clocking of both of latches $L2_0$ and $L2_1$ introduces another aspect of the preferred embodiment. Specifically, and as further appreciated later, the preferred embodiment of clock/data conversion circuit 10 provides an additional clock signal which has a faster frequency than the frequency of the data in $D_{IN}$ and which is designated as $CLK_F$ (where the "F" subscript simply suggests "faster"). By way of example, therefore, assume in the preferred embodiment that the frequency of $CLK_F$ is 150 MHz. $CLK_F$ may be generated by various different types of circuits for generating such a signal as known in the art; indeed, in the instance where clock/data conversion circuit 10 is part of a larger system for connecting to a single data/dual clock interface, such a system may already include a clock signal of sufficient speed so that it may be used as the signal $CLK_F$.

Figure 2:
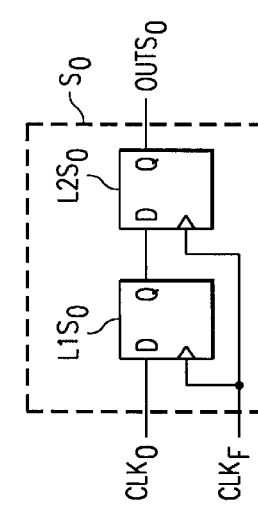
FIG. 2 illustrates a schematic of the synchronizer circuits shown in FIG. 1.

STAGE 2 further includes two synchronizer circuits $S_0$ and $S_1$. Each of synchronizer circuits $S_0$ and $S_1$ is clocked by $CLK_F$. Further, synchronizer circuits $S_0$ and $S_1$ receive as data signals $CLK_0$ and $CLK_1$, respectively. To further illustrate these connections, FIG. 2 illustrates a schematic of synchronizer circuit $S_0$ in greater detail as now discussed, and one skilled in the art will therefore readily appreciate the same implementation for synchronizer circuit $S_1$ (with a different data input). Looking to FIG. 2, synchronizer circuit $S_0$ includes two latches $L1S_0$ and $L2S_0$, both of which are clocked by $CLK_F$. Further, $CLK_0$ is connected to the data input of latch $L1S_0$ and the output of latch $L1S_0$ is connected to the data input of latch $L1S_1$. The output of latch $L1S_1$ provides the output for synchronizer circuit $S_0$ and, for purposes of reference, is shown in FIG. 2 as $OUTS_0$. Returning to FIG. 1, the outputs of synchronizer circuits $S_0$ and $S_1$ are passed to STAGE 3.

STAGE 3 includes two edge detectors $ED_0$ and $ED_1$, each receiving at its input the output from a respective one of synchronizer circuits $S_0$ and $S_1$. In the preferred embodiment, and as detailed below, edge detectors $ED_0$ and $ED_1$ each operate to output a pulse in response to a rising transition at their input, where the end of the pulse occurs at the next rising edge of $CLK_F$. As a result, and as appreciated later, in the preferred embodiment the duration of the output pulse of edge detectors $ED_0$ and $ED_1$ is equal to the period of $CLK_F$. The outputs of edge detectors $ED_0$ and $ED_1$ are passed to STAGE 4, and are also used as inputs to a multiplexer ("mux") control circuit MC in STAGE 3, where mux control circuit MC controls a three-input mux M as further detailed later. Looking now to mux M, two of its three inputs are connected to the outputs of latches $L2_0$ and $L2_1$ from STAGE 2. The third mux M input is discussed below in connection with STAGE 4, and it is also noted that the output of mux M is passed to STAGE 4.

Figure 3:
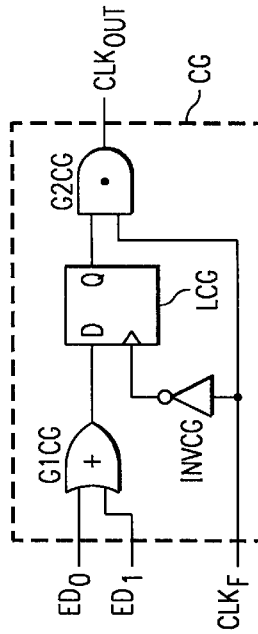
FIG. 3 illustrates a schematic of the gate control circuit shown in FIG. 1.

STAGE 4 includes a latch $L_M$ which receives at its data input the output of mux M, and which is clocked by $CLK_F$. STAGE 4 also includes a latch $L_{OUT}$ which receives at its data input the output of latch $L_M$. By way of introduction, latch $L_{OUT}$ operates to provide the single data output for clock/data conversion circuit 10, designated in FIG. 1 as $D_{OUT}$. Further, latch $L_{OUT}$ is clocked by a clock gate circuit CG which is also included in STAGE 4. By way of introduction, clock gate circuit CG operates in response to earlier STAGE clock-related signals to provide the single clock output for clock/data conversion circuit 10, designated in FIG. 1 as $CLK_{OUT}$. To further introduce this operation, FIG. 3 illustrates a schematic of clock gate circuit CG in greater detail. Looking therefore to FIG. 3, clock gate circuit CG has three inputs, two of which are connected to the outputs of edge detectors $ED_0$ and $ED_1$ from STAGE 3. A third input is connected to $CLK_F$. The inputs provided from edge detectors $ED_0$ and $ED_1$ are connected to a logic OR gate G1CG, which has its output connected to the data input of a latch LCG. Latch LCG is clocked by the complement of $CLK_F$, which is provided by an inverter INVCG having its input connected to receive $CLK_F$ and its output connected to the clock input of latch LCG. The output of latch LCG is connected to a first input of a logic AND gate G2CG, while a second input of AND gate G2CG receives $CLK_F$. The output of AND gate G2CG provides the output of clock gate circuit CG and, thus, as introduced above, provides the single clock output $CLK_{OUT}$.

The operation of clock/data conversion circuit 10 is now described, and is first introduced here on a stage-by-stage basis, and then followed by a more detailed analysis by examining the signals passing through the circuits of each stage. Generally, STAGE 1 takes the single data/dual clock signals provided by an interface (not shown) or some other circuit, and converts the data to two separate paths, thereby providing one data path per each of clocks $CLK_0$ and $CLK_1$. Next, STAGE 2 synchronizes the dual paths from STAGE 1 to a clock speed that is higher than the combined frequency of the two data paths. Next, STAGE 3 merges the dual data paths from STAGE 2 into a single higher speed data path, that is, here the path is now provided at the higher clock speed from STAGE 2. Finally, STAGE 4 recognizes that the increase in speed provided by STAGE 2 and the data combination by STAGE 3 will cause some of the data from the original lower speed single path to be duplicated in successive cycles at the higher speed; accordingly, STAGE 4 provides proper gating of the clock signal and suppression of the duplicate data so that a single output clock is provided having rising transitions corresponding to a single data stream.

Figure 4:
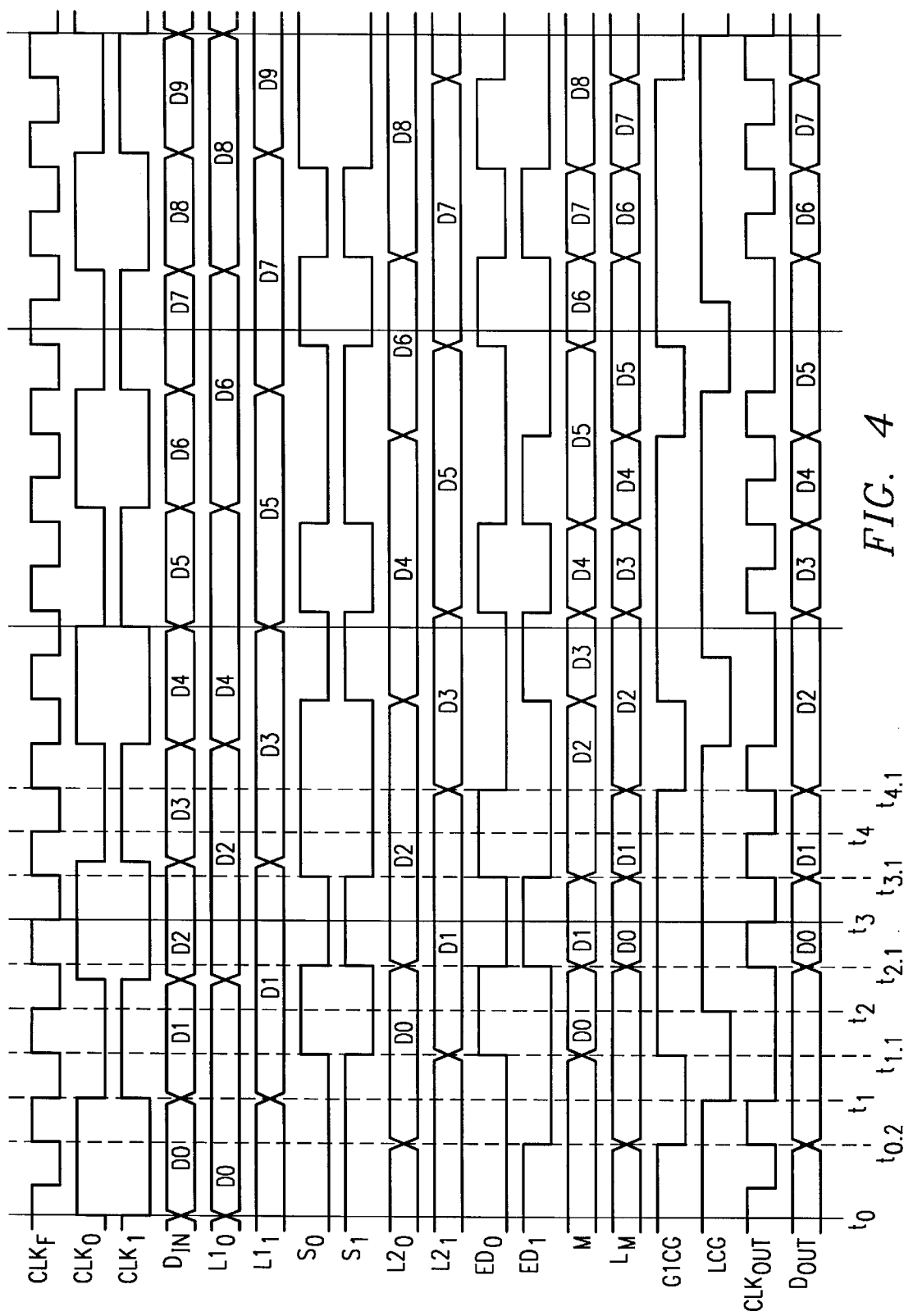
FIG. 4 illustrates a timing diagram demonstrating the operation of the clock/data conversion circuit of FIG. 1.

Each of the STAGE operations introduced above is now explored in greater detail by reference to a timing diagram shown in FIG. 4. By way of introduction, FIG. 4 illustrates time along its horizontal axis and illustrates numerous signals along its vertical axis, where the signal identifier in FIG. 4 corresponds to the identifiers used in the previous Figures. Thus, the top four signals in FIG. 4 illustrate the inputs (clock and data) to clock/data conversion circuit 10, while the bottom two signals in FIG. 4 illustrate the outputs of clock/data conversion circuit 10. Note further that where a circuit identifier is used in FIG. 4 then the timing signal shown with that identifier corresponds to the output of the identified circuit; for example, the fifth signal from the top of FIG. 4 is labeled $L1_0$ and, thus, it illustrates the output of latch $L1_0$ of STAGE 1.

The first three signals illustrated at the top of FIG. 4 demonstrate the relationship of clock signals introduced earlier. Thus, $CLK_0$ and $CLK_1$ are shown at the same frequency and out of phase with respect to one another. Further, the fast clock $CLK_F$ is shown and recall it has a frequency that is faster than the frequency of the data in $D_{IN}$. Thus, since $D_{IN}$ is at a rate of twice the frequency of either $CLK_0$ or $CLK_1$, the illustration of FIG. 4 also demonstrates that $CLK_F$ has a frequency greater than twice the frequency of either $CLK_0$ or $CLK_1$.

The signal illustrated fourth from the top in FIG. 4 depicts data $D_{IN}$. By way of example and for purposes of reference in the remainder of this document, each data quantity is successively labeled starting at a time $t_0$, where at $t_0$ $D_{IN}$ transitions and a new data D0 is provided. Also for sake of reference, each such quantity is referred to for the remainder of this document as a "word" or "data word," but this is not intended to indicate that the quantity has a particular number of bits other than to note that all words in a given stream typically have a same number of bits; for example, a typical number of bits in a data word provided via the gigabit interface is ten bits. Note further that word D0 is aligned with the rising transition of $CLK_0$. Since $D_{IN}$ represents a single data stream corresponding to both $CLK_0$ and $CLK_1$, then at the next rising edge of $CLK_1$, shown in FIG. 4 at $t_1$, then a new data word D1 is provided. This pattern continues for the remainder of the signal and, thus, FIG. 4 illustrates additional data words D2 through D9 for the successive rising transitions of $CLK_0$ and $CLK_1$.

The operation of latches $L1_0$ and $L1_1$ is now detailed by examining the corresponding outputs of those latches as shown in FIG. 4. Latches $L1_0$ and $L1_1$ operate to latch alternating data words in the incoming stream $D_{IN}$. For example, at $t_0$, $CLK_0$ rises and, from FIG. 4, recall that a rising transition of $CLK_0$ is used to clock latch $L1_0$. Accordingly, at $t_0$, latch $L1_0$ latches the data word of $D_{IN}$ which is then present at its input and, hence, at $t_0$ latch $L1_0$ latches D1, as shown in FIG. 4. Next, at $t_1$, $CLK_1$ rises and, from FIG. 4, recall that a rising transition of $CLK_1$ is used to clock latch $L1_1$. Accordingly, at $t_1$, latch $L1_1$ latches the data word of $D_{IN}$ which is then present at its input and, hence, at $t_1$ latch $L1_1$ latches D2, as shown in FIG. 4. Given the out of phase nature of $CLK_0$ with respect to $CLK_1$, then for each successive rising transition of those clocks, latches $L1_0$ and $L1_1$ continue to operate in this fashion, thereby causing each of those latches to output every other one of the data words in $D_{IN}$, as shown for the remaining time periods in FIG. 4.

The operation of synchronizer circuits $S_0$ and $S_1$ is now detailed by examining the corresponding outputs of those circuits as shown in FIG. 4. First, recall from FIG. 2 that each of circuits $S_0$ and $S_1$ includes two latches clocked by $CLK_F$, with the output from a first latch (e.g., $L1S_0$) output to the data input of a second latch (e.g., $L2S_0$), and where the data is a slower clock (i.e., either $CLK_0$ for $S_0$ or $CLK_1$ for $S_1$). In general, therefore, each rising transition of $CLK_F$ causes a synchronizer circuit to output the state of its corresponding input slow clock as that state existed at the time of the previous $CLK_F$ transition; in other words, each synchronizer takes the state of a slower clock and provides an output that following a delay duplicates the state of the slower clock, but also causes its edges to be constrained by the faster clock $CLK_F$. Turning now to FIG. 4 to illustrate this by example, note between $t_0$ and $t_1$ that $CLK_0$ is high. Further, at $t_{0.2}$, $CLK_F$ transitions high and the high state of $CLK_0$ is latched by the first latch $L1S_0$ of synchronizer circuit $S_0$. Next, at $t_{1.1}$, $CLK_F$ again transitions high and, thus, the high state of $CLK_0$ that was earlier latched by latch $L1S_0$ is now latched by $L2S_0$ and, therefore, is output by synchronizer circuit $S_0$. Also at $t_{1.1}$, the rising transition of $CLK_F$ causes the first latch $L1S_0$ to latch the then existing state of $CLK_0$ (i.e., a low state); accordingly, at $t_{2.1}$, the rising transition of $CLK_F$ causes the $t_{1.1}$ state of $CLK_0$ to be output by synchronizer circuit $S_0$. Given the preceding discussion and examples, one skilled in the art should further appreciate the remaining illustration of the $S_0$ signal in FIG. 4, where it is seen that each rising transition of $CLK_F$ causes synchronizer circuit $S_0$ to output the state of $CLK_0$ as it existed at the previous rising transition of $CLK_F$. Similarly, this same operation should now be appreciated relative to synchronizer circuit $S_1$, with the difference being that its data input is $CLK_1$; thus, each rising transition of $CLK_F$ causes synchronizer circuit $S_1$ to output the state of $CLK_1$ as it existed at the previous rising transition of $CLK_F$.

The operation of latches $L2_0$ and $L2_1$ is now detailed by examining the corresponding outputs of those circuits as shown in FIG. 4. Recall that each of these latches is clocked by $CLK_F$; accordingly, FIG. 4 illustrates that each latch latches the corresponding data at its input for each rising edge of $CLK_F$. To further appreciate this operation, recall from the preceding discussion that each synchronizer circuit $S_0$ and $S_1$ in STAGE 2 effectively converts the states of the slower clocks $CLK_0$ and $CLK_1$ to a higher frequency waveform (i.e., constrained by the edge of $CLK_F$). Thus, given the upward adjusted clock signal, latches $L2_0$ and $L2_1$ of STAGE 2 effectively align the data path to this upward adjusted clock.

The operation of edge detectors $ED_0$ and $ED_1$ is now detailed by examining the corresponding outputs of those circuits as shown in FIG. 4. First, recall it was noted earlier that edge detectors $ED_0$ and $ED_1$ each operate to output a pulse in response to a rising transition provided by a corresponding one of synchronizer circuits $S_0$ and $S_1$. Further, having now demonstrated that a rising transition output by either of synchronizer circuits $S_0$ or $S_1$ is aligned to a rising transition in $CLK_F$, then it now will be appreciated that the beginning of the pulse provided by edge detectors $ED_0$ and $ED_1$ also is aligned to the rising transition in $CLK_F$. Still further, recall that the end of an edge detector pulse was stated to be synchronous with the next rising edge of $CLK_F$. Thus, when a pulse is provided by edge detectors $ED_0$ and $ED_1$, its total duration is equal to the period of $CLK_F$. Given these observations, FIG. 4 illustrates for edge detectors $ED_0$ and $ED_1$ fixed-width pulses following the rising transition of an input from a respective synchronization circuit. For example, at $t_{1.1}$ synchronizer circuit $S_0$ outputs a rising transition; accordingly, also at $t_{1.1}$, edge detector $ED_0$ begins an output pulse which has a duration equal to the period of $CLK_F$. As another example, at $t_{3.1}$, synchronizer circuit $S_0$ transitions high and, here, note that the duration of this high signal is greater than one period of $CLK_F$. Nevertheless, in response to this transition, edge detector $ED_0$ once again outputs a pulse with a duration equal to the period of $CLK_F$. Lastly, the preceding explanation and examples should further lead one skilled in the art to appreciate the comparable operation of edge detector $ED_1$ as illustrated in FIG. 4, where it outputs a fixed duration output pulse in response to a rising transition in synchronizer circuit $S_1$.

The operation of mux control MC and mux M are now detailed by examining the corresponding outputs of those circuits as shown in FIG. 4. By way of introduction, mux control MC is not shown in schematic form because it may be readily constructed by one skilled in the art in various fashions given its functionality, as now described. First, recall that mux M has three data inputs, one from the output of latch $L2_0$, one from the output of latch $L2_1$, and one from the output of latch $L_M$. Second, note that when mux control MC receives a high output from edge detector $ED_0$, then it provides a sufficient control signal to mux M so that mux M outputs the value it is receiving from latch $L2_0$. Similarly, when mux control MC receives a high output from edge detector $ED_1$, then it provides a sufficient control signal to mux M so that mux M outputs the value it is receiving from latch $L2_1$. Lastly, however, given the signals provided by edge detectors $ED_0$ and $ED_1$ as detailed above, then note further that during some time instances neither of these detectors is outputting a high signal. Accordingly, during such times, mux control MC provides a sufficient control signal to mux M so that mux M outputs the value it is receiving from latch $L_M$.

Each of the three above-described alternative input selections by mux M is now explored by way of examples in FIG.

4. At $t_{1.1}$, edge detector $ED_0$ outputs a high pulse and, as shown in FIG. 1, this pulse is communicated to mux control MC. In response, mux control MC causes mux M to output the data it is receiving from latch $L2_0$ at that time and, which as shown in FIG. 4, is word D0. Accordingly, FIG. 4 further illustrates that starting at $t_{1.1}$ word D0 is output by mux M. At $t_{2.1}$, edge detector $ED_1$ outputs a high pulse and this pulse is also communicated to mux control MC. In response, mux control MC causes mux M to output the data it is receiving from latch $L2_1$ at that time and, which as shown in FIG. 4, is word D1. Accordingly, FIG. 4 further illustrates that starting at $t_{2.1}$ word D1 is output by mux M. As another example, at $t_{3.1}$, edge detector $ED_0$ again outputs a high pulse to mux control MC and, in response, mux control MC controls mux M to output the data it is receiving from latch $L2_0$ at that time and, which as shown in FIG. 4, is word D2. Finally, at $t_{4.1}$, note that the outputs of both edge detector $ED_0$ and $ED_1$ are low. At this time, therefore, MC controls mux M so that mux M outputs the feedback value it is receiving from latch $L_M$, which once more is word D2. Thus, in this instance, and as further discussed below, note that mux M continues to output word D2 which it output before $t_{4.1}$ due to the high state from edge detector $ED_0$ and which it outputs after $t_{4.1}$ due to the lack of a high output from edge detector $ED_0$ or $ED_1$.

The operation of latch $L_M$ is now detailed by examining its output as shown in FIG. 4, and further in view of the preceding operational discussion of mux M. First, recall that latch $L_M$ is clocked by $CLK_F$. Thus, for each rising transition of $CLK_F$, latch $L_M$ outputs the value then provided to its data input by mux M. As illustrated by the examples of the preceding paragraph, this causes latch $L_M$ to alternate its output between a data word provided by latch $L2_0$ to mux M and a data word provided by latch $L2_1$ to mux M. Moreover, the output of latch $L_M$ also stores the most recent one of the outputs of mux M for purposes of providing the feedback to mux M for those instances, as described above, when neither edge detector $ED_0$ nor edge detector $ED_1$ is asserted.

The operation of clock gate CG is now examined. By way of introduction, note that the output of latch $L_M$ as illustrated in FIG. 4 demonstrates that it along with the circuitry preceding it effectively produces a single stream of data that duplicates $D_{IN}$ in terms of information, but that is aligned to transitions in $CLK_F$ rather than to either or both of $CLK_0$ and $CLK_1$. Accordingly, the remaining functionality provided by clock gate CG provides a single clock signal that corresponds to this single stream of data. First with respect to clock gate CG, note that the input of $CLK_F$ to AND gate G2CG causes $CLK_{OUT}$ to be low whenever $CLK_F$ is low. Second, $CLK_{OUT}$ is high only when $CLK_F$ is also high, and further when the output of latch LCG is also high. Looking at this latter possibility in greater detail, note that latch LCG outputs a pulse, following a delay, and in response to an assertion of either edge detector $ED_0$ or $ED_1$. Particularly, recall that each of edge detector $ED_0$ or $ED_1$ asserts a pulse starting with a rising edge of $CLK_F$. Recall also that each such output pulse spans one period of $CLK_F$ and, thus, is maintained at the beginning of that period when $CLK_F$ is high and for the remainder of this period when $CLK_F$ is low. Note, therefore, that during the latter part of this time, that is, when $CLK_F$ is low, latch LCG is clocked (due to inverter INVCG) which thereby latches the high pulse from edge detector $ED_0$ or $ED_1$ into latch LCG. Accordingly, having latched the high pulse into latch LCG, on the next rising edge of $CLK_F$, both inputs to AND gate G2CG are high and, thus, $CLK_{OUT}$ is high. Lastly, and as introduced above, $CLK_{OUT}$ stays high until the next falling edge of $CLK_F$.

The operation of clock gate CG is further appreciated by examining its output (i.e., $CLK_{OUT}$) as shown in FIG. 4. For example, at $t_{1.1}$, edge detector $ED_0$ begins an output pulse, and that pulse remains high during the high state of $CLK_F$ from $t_{1.1}$, to $t_2$ and during the next low state of $CLK_F$ from $t_2$ to $t_{2.1}$. Also in response to and during the next low state of $CLK_F$ from $t_2$ to $t_{2.1}$, the $ED_0$ pulse is latched by latch LCG of clock gate CG and, thus, it is output to AND gate G2CG. Next, $CLK_F$ transitions high at $t_{3.1}$, and this high is also provided to AND gate G2CG. Accordingly at that time $t_{3.1}$ the output of AND gate G2CG (i.e., $CLK_{OUT}$) goes high, and it remains high until $CLK_F$ transitions low at t4. Concluding this example, therefore, $CLK_{OUT}$ illustrates a pulse between $t_{3.1}$ and $t_4$ having the same duration as a high pulse of $CLK_F$. Given this example and illustration, one skilled in the art should now appreciate the following two observations. First, the operation of clock gate CG is such that output pulses in $CLK_{OUT}$ are delayed responses to output pulses in either edge detector $ED_0$ or $ED_1$, and the end of the pulses of edge detectors $ED_0$ and $ED_1$ and clock gate CG are constrained by falling transitions of $CLK_F$. Second, the resulting output pulses in $CLK_{OUT}$ provide a pulse for each change in data output by latch $L_M$. For example, at $t_{2.1}$, there is shown a $CLK_{OUT}$ pulse corresponding to D0 output by latch $L_M$, and as another example at $t_{3.1}$ there is shown a $CLK_{OUT}$ pulse corresponding to D1 output by latch $L_M$, and so forth for the remaining data words output by latch $L_M$ as shown in FIG. 4.

The operation of clock gate CG as just described also further demonstrates the operation and benefit of the feedback path between latch $L_M$ and mux M introduced above, and also provides a conclusion of the operation of STAGEs 2 through 4 of clock/data conversion circuit 10. Specifically, recall earlier that STAGE 4 was described to recognize that the increase in speed provided by STAGE 2 and the data combination by STAGE 3 will cause some of the data from the original lower speed single path to be duplicated in successive cycles at the higher speed. This now may be seen by way of example in FIG. 4. For example, looking to the relationship between $D_{IN}$ and $CLK_F$, note that only a single rising transition in $CLK_F$ occurs during the duration of each of words D0 and D1; as a result, each of these words are sampled only once by STAGE 2 and are output by mux M and latch $L_M$ for a single $CLK_F$ period. With respect to D2 in $D_{IN}$, however, note that it is sampled in STAGE 2 a first instance at $t_{2.1}$ in response to a first rising transition of $CLK_F$ and a second instance at $t_{3.1}$ in response to a second rising transition of $CLK_F$. As a result, with no additional action, D2 could appear twice in $D_{OUT}$ with two transitions in $CLK_F$. However, while latch $L_M$ of STAGE 4 maintains an output of D2 (and provides a feedback to STAGE 3) for two periods of $CLK_F$, at the same time clock gate CG effectively suppresses the second rising transition of $CLK_F$ from reaching the output of clock/data conversion circuit 10 in the form of $CLK_{OUT}$. In other words, it may be seen at $t_{4.1}$ that $CLK_{OUT}$ pulses once in response to the $CLK_F$ pulse beginning at $t_{2.1}$ which sampled D2, but $CLK_{OUT}$ does not pulse a second time in response to the $CLK_F$ pulse beginning at $t_{3.1}$ which also sampled D2. Accordingly, $CLK_{OUT}$ is effectively a modified version of $CLK_F$ in that $CLK_{OUT}$ represents selected ones of the periods of $CLK_F$ such that the $CLK_{OUT}$ signal transitions only once for each data word in the single data stream. As a result, for each data word output by latch $L_M$, there is only a single corresponding pulse in $CLK_{OUT}$.

Lastly, the operation of latch $L_{OUT}$ is now described. First, recall from FIG. 1 that latch $L_{OUT}$ provides the single data output for clock/data conversion circuit 10, designated in FIG. 1 as $D_{OUT}$ and shown in the bottom row of FIG. 4. Second, the preceding discussion has demonstrated that latch $L_M$ outputs a data stream that alternates between a data word from latch $L2_0$ and a data word from latch $L2_1$ and thereby re-creates in a single stream the data from DIN; moreover, clock gate CG provides a clocking signal $CLK_{OUT}$ corresponding to this stream whereby a single rising transition occurs in $CLK_{OUT}$ for each change in data in the output of latch $L_M$. Given this timing of $CLK_{OUT}$ and since $CLK_{OUT}$ is used to clock latch $L_{OUT}$, then latch $L_{OUT}$ logically duplicates the output of latch $L_M$, as shown in the bottom row of FIG. 4. Lastly in this regard, while latch $L_{OUT}$ therefore may appear to be superfluous in view of latch $L_M$, in practice latch $L_{OUT}$ is beneficial because without it the data and clocks may tend to become skewed which could create problems for circuitry using the output signals. Accordingly, latch $L_M$ re-times the data to match the signal provided by $CLK_{OUT}$.

From the above, it may be appreciated that the above embodiments provide a single output clock and output data stream from an interface having multiple clocks and an input data stream. Further, note that this operation is achieved using a fully digital solution and, hence does not suffer from the drawbacks of an implementation such as the PLL approach described in the Background Of The Invention section of this document. Moreover, a digital solution is less expensive and its operation is typically more consistent. Still further, the functionality described above with the given digital solution may be achieved with alternate digital circuits given the teachings of this document and the skill in the art. Finally, while the while the present embodiments have been described in detail, various substitutions, modifications or alterations could be made to the descriptions set forth above without departing from the inventive scope. For example, while the preferred embodiment is directed to an interface having a single input data stream and two clocks, it may be readily altered in the event that an interface or the like is provided with a multiple number of clocks greater than two clocks. Accordingly, this example as well as the preceding discussion further illustrates the inventive scope, as is defined by the following claims.

What is claimed is:

1. A circuit for producing a single output data stream and a corresponding single clock signal, comprising:
    an input for receiving a single input data stream, the input data stream having data words at a first frequency;
    a plurality of clock inputs for receiving a plurality of corresponding clock signals, wherein each of the plurality of corresponding clock signals is synchronized to a corresponding plurality of the data words;
    an input for receiving a fast clock signal, the fast clock signal having a fast frequency greater than the first frequency;
    circuitry for sampling the input data stream at the fast frequency;
    circuitry for outputting the sampled data as the single output data stream;
    circuitry for outputting the single clock signal in response to the fast clock signal;
    wherein the fast clock signal consists of successive periods, wherein each of the successive periods consists of a high state and a low state; and
    wherein the circuitry for outputting the single clock signal comprises circuitry for outputting a modified clock signal representing selected ones of the successive periods of the fast clock signal such that the modified clock signal transitions only once for each data word in the single output data stream.

2. The circuit for producing a single output data stream and a corresponding single clock signal of claim 1 wherein the circuitry for outputting a modified clock signal further comprises circuitry for outputting a low signal between the selected ones of the successive periods of the fast clock signal.

3. The circuit for producing a single output data stream and a corresponding single clock signal of claim 1
    wherein the plurality of clock inputs consists of two clock inputs; and
    wherein the plurality of corresponding clock signals consist of a first clock signal and a second clock signal.

4. The circuit for producing a single output data stream and a corresponding single clock signal of claim 3 wherein the circuitry for sampling the input data stream comprises:
    a first latch having a data input coupled to the input for receiving the single input data stream, the first latch coupled to be clocked by the first clock signal;
    a second latch having a data input coupled to the input for receiving the single input data stream, the second latch coupled to be clocked by the second clock signal;
    a third latch having a data input coupled to an output of the first latch, the third latch coupled to be clocked by the fast clock signal; and
    a fourth latch having a data input coupled to an output of the second latch, the fourth latch coupled to be clocked by the fast clock signal.

5. The circuit for producing a single output data stream and a corresponding single clock signal of claim 4 wherein the circuitry for outputting the sampled data as the single output data stream comprises:
    a multiplexer, comprising:
        a first input coupled to an output of the third latch;
        a second input coupled to an output of the fourth latch; and
        a third input; and
    a fifth latch having a data input coupled to an output of the multiplexer and an output coupled to the third input of the multiplexer, wherein the fifth latch is coupled to be clocked by the fast clock signal.

6. The circuit for producing a single output data stream and a corresponding single clock signal of claim 5 wherein the circuitry for outputting the single clock cycle in response to the fast clock signal comprises:
    a first synchronizer circuit having an input coupled to receive the first clock signal wherein the first clock signal has a high state and a low state, and wherein the first synchronizer circuit has an output for producing a first synchronization signal that, following a delay, duplicates states of the first clock signal wherein the duplicate states of the first clock signal have transitions constrained by the fast clock signal; and
    a second synchronizer circuit having an input coupled to receive the second clock signal wherein the second clock signal has a high state and a low state, and wherein the second synchronizer circuit has an output for producing a second synchronization signal that, following a delay, duplicates states of the second clock signal wherein the duplicate states of the second clock signal have transitions constrained by the fast clock signal.

7. The circuit for producing a single output data stream and a corresponding single clock signal of claim 6 wherein the circuitry for outputting the single clock cycle in response to the fast clock signal further comprises:

a first edge detector coupled to an output of the first synchronizer circuit and operable to output a first edge detector pulse in response to a rising transition provided by the output of the first synchronizer circuit; and a second edge detector coupled to an output of the second synchronizer circuit and operable to output a second edge detector pulse in response to a rising transition provided by the output of the second synchronizer circuit.

8. The circuit for producing a single output data stream and a corresponding single clock signal of claim 7 wherein each of the first edge detector pulse and the second edge detector pulse have a duration equal to a period of the fast clock signal.

9. The circuit for producing a single output data stream and a corresponding single clock signal of claim 8 wherein the circuitry for outputting the single clock signal comprises circuitry for outputting a modified clock signal representing selected ones of the successive periods of the fast clock signal comprises:

an input coupled to an output of the first edge detector;
an input coupled to an output of the second edge detector;
an input for receiving the fast clock signal, wherein the fast clock signal has a high state during a first time period a low state during a second time period; and
circuitry for outputting the modified clock signal in response to an assertion from either the output of first edge detector or the output of second edge detector, wherein the modified clock signal is asserted high for a time period equal to the first time period.

10. The circuit for producing a single output data stream and a corresponding single clock signal of claim 1 wherein the single input data stream and the plurality of corresponding clock signals are provided via an internet gigabit interface.

11. A circuit for producing a single output data stream and a corresponding single clock signal comprising:

an input for receiving a single input data stream, the input data stream having data words at a first frequency;

a plurality of clock inputs for receiving a plurality of corresponding clock signals, wherein each of the plurality of corresponding clock signals is synchronized to a corresponding plurality of data words;

an input for receiving a fast clock signal, the fast clock signal having a fast frequency greater than the first frequency;

circuitry for sampling the input data stream at the fast frequency;

circuitry for outputting the sampled data as the single output data stream;

circuitry for outputting the single clock signal in response to the fast clock signal;

wherein the plurality of clock inputs consists of two clock inputs; and wherein the plurality of corresponding clock signals consists of a first clock signal and a second clock signal;

wherein the circuitry for sampling the input data stream comprises:

a first latch having a data input coupled to the input for receiving the single input data stream, the first latch coupled to be clocked by the first clock signal;

a second latch having a data input coupled to the input for receiving the single input data stream, the second latch coupled to be clocked by the second clock signal;

a third latch having a data input coupled to an output of the first latch, the third latch coupled to be clocked by the fast clock signal; and a fourth latch having a data input coupled to the output of the second latch, the fourth latch coupled to be clocked by the fast clock signal.

12. The circuit for producing a single output data stream and a corresponding single clock signal of claim 11 wherein the circuitry for outputting the sampled data as the single output data stream comprises:

a multiplexer, comprising:
a first input coupled to an output of the third latch;
a second input coupled to an output of the fourth latch; and
a third input; and a fifth latch having a data input coupled to an output of the multiplexer and an output coupled to the third input of the multiplexer, wherein the fifth latch is coupled to be clocked by the fast clock signal.

13. The circuit for producing a single output data stream and a corresponding single clock signal of claim 12 wherein the circuitry for outputting the single clock cycle in response to the fast clock signal comprises:

a first synchronizer circuit having an input coupled to receive the first clock signal wherein the first clock signal has a high state and a low state, and wherein the first synchronizer circuit has an output for producing a first synchronization signal that, following a delay, duplicates states of the first clock signal wherein the duplicate states of the first clock signal have transitions constrained by the fast clock signal;

a second synchronizer circuit having an input coupled to receive the second clock signal wherein the second clock signal has a high state and a low state, and wherein the second synchronizer circuit has an output for producing a second synchronization signal that, following a delay, duplicates states of the second clock signal wherein the duplicate states of the second clock signal have transitions constrained by the fast clock signal;

a first edge detector coupled to an output of the first synchronizer circuit and operable to output a first edge detector pulse in response to a rising transition provided by the output of the first synchronizer circuit;

a second edge detector coupled to an output of the second synchronizer circuit and operable to output a second edge detector pulse in response to a rising transition provided by the output of the second synchronizer circuit; and wherein each of the first edge detector pulse and the second edge detector pulse have a duration equal to a period of the fast clock signal.

14. The circuit for producing a single output data stream and a corresponding single clock signal of claim 13 wherein the circuitry for outputting the single clock signal comprises circuitry for outputting a modified clock signal representing selected ones of the successive periods of the fast clock signal comprises:

an input coupled to an output of the first edge detector;
an input coupled to an output of the second edge detector;
an input for receiving the fast clock signal, wherein the fast clock signal has a high state during a first time period a low state during a second time period; and
circuitry for outputting the modified clock signal in response to an assertion from either the output of first edge detector or the output of second edge detector, wherein the modified clock signal is asserted high for a time period equal to the first time period.

15. A method for producing a single output data stream and a corresponding single clock signal, comprising:

receiving a single input data stream, the input data stream having data words at a first frequency;

receiving a plurality of corresponding clock signals, wherein each of the plurality of corresponding clock signals is synchronized to a corresponding plurality of the data words;

receiving a fast clock signal, the fast clock signal having a fast frequency greater than the first frequency;

sampling the input data stream at the fast frequency;

outputting the sampled data as the single output data stream;

outputting the single clock signal in response to the fast clock signal;

wherein the fast clock signal consists of successive periods, wherein each of the successive periods consists of a high state and a low state; and wherein the step of outputting the single clock signal comprises outputting a modified clock signal representing selected ones of the successive periods of the fast clock signal such that the modified clock signal transitions only once for each data word in the single output data stream.

16. The method for producing a single output data stream and a corresponding single clock signal of claim 15 wherein the step of outputting a modified clock signal further comprises outputting a low signal between the selected ones of the successive periods of the fast clock signal.

17. The method for producing a single output data stream and a corresponding single clock signal of claim 15:

wherein the plurality of clock inputs consists of two clock inputs; and wherein the plurality of corresponding clock signals consist of a first clock signal and a second clock signal.

* * * * *